United States Patent
Kim et al.

(10) Patent No.: US 7,146,077 B2
(45) Date of Patent: Dec. 5, 2006

(54) OPTICAL COUPLER TYPE FILTER AND WAVELENGTH STABILIZING APPARATUS OF LIGHT SOURCE USING THE SAME

(75) Inventors: Se-Yoon Kim, Yongin-si (KR); Sun-Tae Jung, Anyang-si (KR); Jeong-Hwan Song, Seoul (KR); Kyung-Shik Lee, Seoul (KR); Jong-Hoon Lim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 258 days.

(21) Appl. No.: 10/935,370

(22) Filed: Sep. 7, 2004

(65) Prior Publication Data

US 2005/0226558 A1 Oct. 13, 2005

(30) Foreign Application Priority Data

Apr. 9, 2004 (KR) ............................... 2004-24417

(51) Int. Cl.
*G02B 6/26* (2006.01)
*H04J 14/02* (2006.01)

(52) U.S. Cl. .......................... 385/37; 385/42; 398/82; 398/87; 398/94; 398/95

(58) Field of Classification Search ................. 385/30, 385/39, 40, 42, 37, 14, 129, 130, 131, 132; 398/82, 94, 85, 87, 93, 95
See application file for complete search history.

(56) References Cited

U.S. PATENT DOCUMENTS

| | | | | |
|---|---|---|---|---|
| 4,737,007 A | * | 4/1988 | Alferness et al. | 385/30 |
| 5,778,119 A | * | 7/1998 | Farries | 385/37 |
| 5,978,530 A | * | 11/1999 | Russell et al. | 385/37 |
| 6,236,782 B1 | * | 5/2001 | Kewitsch et al. | 385/43 |
| 6,578,388 B1 | * | 6/2003 | Kewitsch et al. | 65/406 |
| 2004/0101249 A1 | * | 5/2004 | Tseng et al. | 385/50 |
| 2005/0226558 A1 | * | 10/2005 | Kim et al. | 385/37 |

* cited by examiner

Primary Examiner—Brian M. Healy
(74) Attorney, Agent, or Firm—Cha & Reiter, LLC

(57) ABSTRACT

Disclosed are an optical coupler type filter, and a wavelength stabilizing apparatus of a light source using the same. The wavelength stabilizing apparatus includes an optical coupler type filter including a first waveguide provided with first and second terminals, a second waveguide provided with a third terminal, a coupling region where the first and second waveguides are adjacent to each other so as to couple lights, and a grating disposed in the coupling region, a light source for outputting light to the first terminal, a first optical detector for detecting extracted light outputted from the third terminal as a first electric signal, a signal processor for determining the wavelength of the light outputted from the light source based on the power of the first electric signal, and outputting a control signal in the case that the wavelength of the light deviates from a stabilizing wavelength, and a driver for controlling the output wavelength of the light source based on the control signal, wherein the length of a sub-region of the coupling region, formed between the grating and the first terminal is set to minimize the power of a recurrent light reflected by the grating and outputted to the first terminal.

15 Claims, 8 Drawing Sheets

OPTICAL COUPLER TYPE FILTER AND WAVELENGTH STABILIZING APPARATUS OF LIGHT SOURCE USING THE SAME

CLAIM OF PRIORITY

This application claims priority to a patent application entitled "OPTICAL COUPLER TYPE FILTER AND WAVELENGTH STABILIZING APPARATUS OF LIGHT SOURCE USING THE SAME", filed in the Korean Intellectual Property Office on Apr. 9, 2004 and assigned Serial No. 2004-24417, the contents of which are hereby incorporated by reference.

BACKGROUND OF THE INVENTION

1. Field of the Invention

The present invention relates to a light source, and more particularly to an apparatus for stabilizing a wavelength of a light source.

2. Description of the Related Art

Recent development of public networks, such as the Internet, etc. requires ultrahigh-speed optical communication, and an optical transmission method using wavelength division multiplexing (WDM) has been widely used. In order to improve the performance of a WDM optical transmission system, it is necessary to increase the number of channels contained in a designated bandwidth. Intervals between wavelengths can be sufficiently reduced by stabilizing the wavelengths of a light source. An operating wavelength of a distributed feedback laser diode (DFB), which is generally used as a light source of the WDM optical communication system, varies according to variations in surrounding environment, e.g., temperature, and is further deteriorated because of the time duration at it is used. Thus, DFBs are not suitable for being set to a desired wavelength for extended periods.

In one conventional method for stabilizing the wavelength of a laser diode, a thin-film type optical filter or Fabry-Perot etalon filter is used that selectively transmits or reflects light emitted from the laser diode according to the wavelengths of the light, and then senses and stabilizes the light. Since the above conventional method employs the thin-film type or crystal type optical filter, it is difficult to manufacture a wavelength stabilizing apparatus integrated into an optical fiber or a planar lightwave circuit (PLC) and the wavelength stabilizing apparatus has a high loss and failure rate In order to solve the above problems, another method is proposed for using an optical fiber Bragg grating (FBG) formed in an optical fiber. Conventionally, the FBG includes an optical fiber having a core provided with a grating engraved therein and a clad surrounding the core, and a planar lightwave circuit having a core (or, a core layer or a waveguide) provided with a grating engraved therein and a clad (or, a cladding layer) surrounding the core.

FIG. 1 is a block diagram of a conventional wavelength stabilizing apparatus of a light source. The wavelength stabilizing apparatus 100 comprises a light source (LS) 110, an optical isolator (ISO) 120, an optical coupler type filter 130, a grating 140, a first optical detector ($OD_1$) 150, a second optical detector ($OD_2$) 160, a signal processor 170, and a driver 180.

The light source 110 outputs light having a known wavelength through both surfaces thereof so that light 112 outputted from the light source 110 through the front surface is used in optical communication and light 114 outputted from the light source 110 through the rear surface is used for stabilizing the wavelength. A semiconductor light source, such as a laser diode, may be used as the light source 110.

The optical isolator 120 is disposed between the rear surface of the light source 110 and the optical coupler type filter 130, and passes light 114 outputted from the rear surface of the light source 110 and isolates light inputted in the opposite direction.

The optical coupler type filter 130 is disposed between the optical isolator 120 and the grating 140, and includes a first waveguide 132 provided with first and second terminals ($A_1$ and $A_2$), a second waveguide 134 provided with third and fourth terminals ($A_3$ and $A_4$), and a coupling region 137 where the first and second waveguides 132 and 134 are adjacent to each other. The first terminal ($A_1$) is connected to the optical isolator 120, the second terminal ($A_2$) is a free end, the third terminal ($A_3$) is connected to the second optical detector 160, and the fourth terminal ($A_4$) is connected to the first optical detector 150. The optical coupler type filter 130 is divided into three regions, i.e., the coupling region 137, a first connecting region 136 formed between the coupling region 137 and the first or third terminal ($A_1$ or $A_3$), and a second connecting region 138 formed between the coupling region 137 and the second or fourth terminal ($A_2$ or $A_4$). The light 114 inputted to the first terminal ($A_1$) passes through the coupling region 137, thereby being transferred from the first waveguide 132 to the second waveguide 134 (this is referred to as "coupling"). The transferred light 114 is then provided to the fourth terminal ($A_4$).

The grating 140 is disposed between the fourth terminal ($A_4$) of the optical coupler type filter 130 and the second optical detector 160, and serves to transmit a partial light 115 (hereinafter, referred to as "transmitted light") having the designated wavelength of the light 114 and to reflect the remainder lights 116 and 117, i.e., light have a wavelength other than the designated wavelength. For example, the grating 140 is manufactured by irradiating ultraviolet rays on a core made of a photosensitive material through a phase mask. The lights 116 and 117 reflected by the grating 140 are inputted to the fourth terminal ($A_4$), and pass through the coupling region 137. The light 116 (hereinafter, referred to as "extracted light") is provided to the third terminal ($A_3$), and the light 117 (hereinafter, referred to as "recurrent light") is provided to the first terminal ($A_1$). The branch rate of the reflected lights 116 and 117 is determined by the multiplication of a length of the coupling region 137 and a coupling coefficient ($K_{ab}$) representing a degree of coupling of the first and second waveguides 132 and 134.

The first optical detector 150 detects the extracted light 116 inputted from the third terminal (A3) as an electric signal (hereinafter, referred to as a "first electric signal"), and the second optical detector 160 detects the transmitted light 115 inputted from the grating 140 as an electric signal (hereinafter, referred to as a "second electric signal"). Each of the first and second optical detectors 150 and 160 may include a photo diode.

The signal processor 170 determines the wavelengths of the lights 112 and 114 outputted from the light source 110 based on powers of the first and second electric signals inputted from the first and second optical detectors 150 and 160. That is, in case that a difference between the power of the extracted light 116 and the power of the transmitted power 115 is less than a designated value, it is determined that the light source 110 normally outputs the light having a designated wavelength (that is, the light source 110 is operating normally). On the other hand, in case that the difference between the power of the extracted light 116 and the power of the transmitted power 115 is not less than the designated value, it is determined that the light source 110 is operating abnormally. In case that the light source 110 is operating abnormally, the signal processor 170 outputs a control signal to the driver 180 to drive light source 110 from the abnormal operation.

The driver 180 stabilizes the output wavelength of the light source 110 based on the control signal. For example, the driver 180 increases or decreases an operating temperature of the light source 110 to stablize the wavelength.

As described above, the optical isolator 120 prevents the output characteristics of the light source 110 from being deteriorated due to the influence of the input of the recurrent light 117 to the light source 110, that is reflected by the grating 140.

However, the optical isolator 120 is an expensive product, thus increasing the production costs of the wavelength stabilizing apparatus 100. Further, the optical isolator 120 increases the volume of the wavelength stabilizing apparatus 100. Moreover, since it is difficult to manufacture the optical isolator 120 in a planar lightwave circuit type, the wavelength stabilizing apparatus 100 cannot be integrated into a planar lightwave circuit.

Accordingly, there is a need in the industry for a lower-cost apparatus for wavelength stabilizing laser outputs.

SUMMARY OF THE INVENTION

The present invention has been made in view of the above problems, and it is an object of the present invention to provide a wavelength stabilizing apparatus of a light source, which does not require an optical isolator, and an optical coupler type filter applied thereto.

It is another object of the present invention to provide a wavelength stabilizing apparatus of a light source, which is easily integrated into a planar lightwave circuit.

In accordance with one aspect of the present invention, the above and other objects can be accomplished by the provision of an optical coupler type filter comprising a first waveguide provided with first and second terminals for receiving light inputted from the outside, a second waveguide provided with a third terminal, a coupling region, where the first and second waveguides are adjacent to each other so as to couple light, and a grating, disposed in the coupling region, for outputting extracted light, having a wavelength coinciding with a reflected wavelength, out of light inputted from the first terminal to the third terminal and outputting residual transmitted light out of the light inputted from the first terminal to the second terminal, wherein the length of a sub-region of the coupling region, which is formed between the grating and the first terminal, is set so as to minimize the power of recurrent light reflected by the grating and then outputted to the first terminal.

In accordance with another aspect of the present invention, there is provided a wavelength stabilizing apparatus of a light source, the wavelength stabilizing apparatus comprising an optical coupler type filter including a first waveguide provided with first and second terminals, a second waveguide provided with a third terminal, a coupling region where the first and second waveguides are adjacent to each other so as to couple lights, and a grating disposed in the coupling region; a light source for outputting light to the first terminal; a first optical detector for detecting extracted light outputted from the third terminal as a first electric signal, a signal processor for determining the wavelength of the light outputted from the light source based on the power of the first electric signal, and outputting a control signal in case that the wavelength of the light deviates from a stabilizing wavelength, and a driver for controlling the output wavelength of the light source based on the control signal, wherein the length of a sub-region of the coupling region, which is formed between the grating and the first terminal, is set so as to minimize the power of recurrent light reflected by the grating and then outputted to the first terminal.

BRIEF DESCRIPTION OF THE DRAWINGS

The above features and other advantages of the present invention will be more clearly understood from the following detailed description taken in conjunction with the accompanying drawings, in which.

DETAILED DESCRIPTION OF THE INVENTION

Now, embodiments of the present invention will be described in detail with reference to the annexed drawings. In the following description of the present invention, a detailed description of known functions and configurations incorporated herein will be omitted when it may make the subject matter of the present invention unclear.

Figure 1:
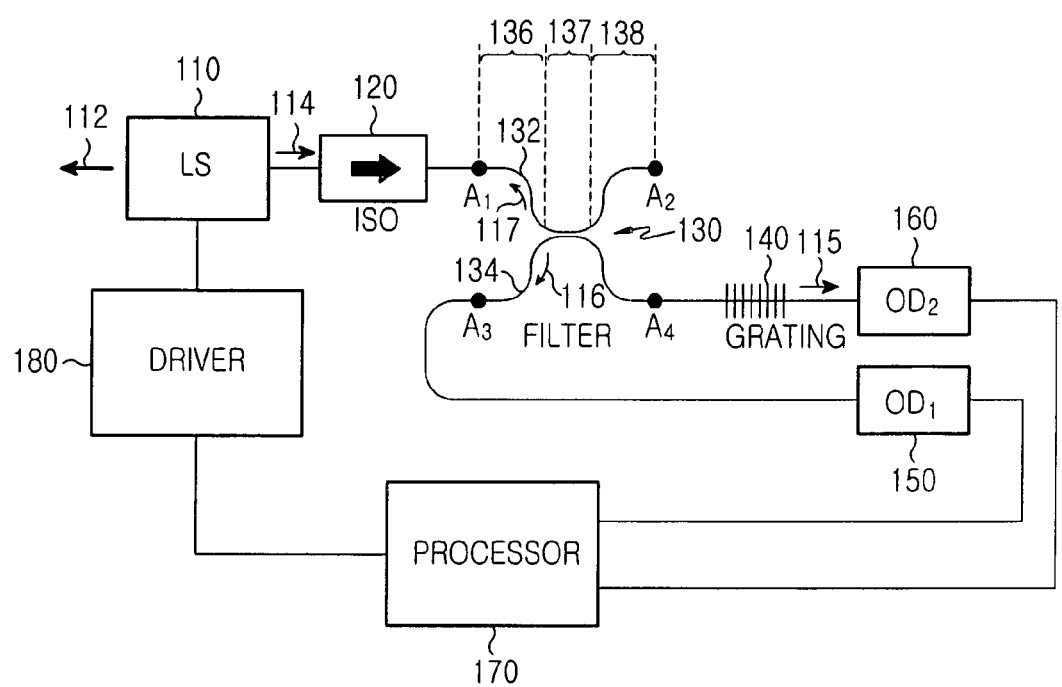
FIG. 1 is a block diagram of a conventional wavelength stabilizing apparatus of a light source.
Figure 2:
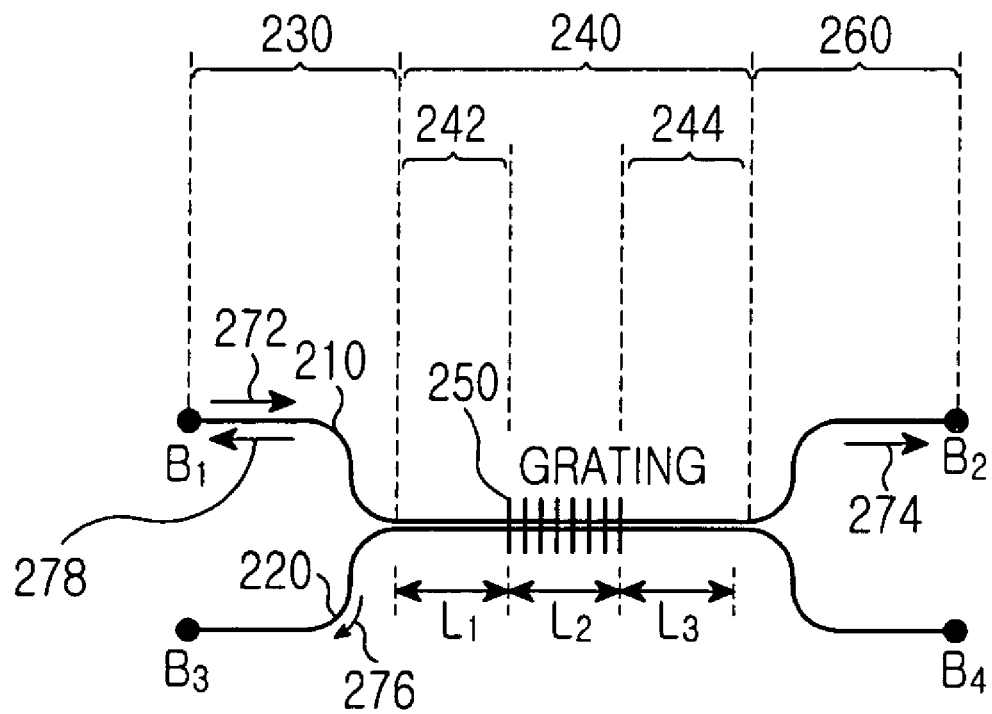
FIG. 2 is a schematic view of an optical coupler type filter in accordance with preferred embodiment of the present invention.

FIG. 2 is a schematic view of an optical coupler type filter in accordance with a preferred embodiment of the present invention. The optical coupler type filter 200 comprises a first waveguide 210 provided with first and second terminals ($B_1$ and $B_2$), a second waveguide 220 provided with third and fourth terminals ($B_3$ and $B_4$), a coupling region 240 where the first and second waveguides 210 and 220 are adjacent to each other, and contained within coupling region 240 is grating 250 suitable for reflecting wavelength ($\lambda_B$) and passing other wavelengths.

The optical coupler type filter 200 is divided into three regions, i.e., the coupling region 240, a first connecting region 230 formed between the coupling region 240 and the first or third terminal ($B_1$ or $B_3$), and a second connecting region 260 formed between the coupling region 240 and the second or fourth terminal ($B_2$ or $B_4$). The grating 250 is placed in the coupling region 240. Thus, the coupling region 240 in addition to grating 250, includes first and second sub-regions 242 and 244 placed at both sides of the grating 250, (i.e., sub-regions of the coupling region 240 where the grating 250 is not placed). The first sub-region 242 is disposed between the first coupling region 230 and the grating 250, and the second sub-region 244 is disposed between the grating 250 and the second coupling region 260. For example, the grating 250 may be manufactured by irradiating ultraviolet rays on parts of the first and second waveguides 210 and 220 placed in the coupling region 240 and made of a photosensitive material through a phase mask. Light 272 inputted to the first terminal (B$_1$) is inputted to the grating 250 placed in the coupling region 240. Partial lights 276 and 278 having wavelengths coinciding with the reflected wavelength, contained within the wavelength band of input light 272 are reflected by the grating 250, and a residual light 274 (hereinafter, referred to "transmitted light"), contained within the wavelength band of input light 272, passes through the grating 250, and is then outputted to the second terminal (B$_2$). The lights 276 and 278, reflected by the grating 250, are outputted to the first and third terminals (B$_1$ and B$_3$). The branch rate of the reflected lights 276 and 278 into the first and third terminals (B$_1$ and B$_3$) is determined by the length (L$_1$) of the first sub-region 230. Hereinafter, for convenience in understanding, the reflected light 278 outputted to the first terminal (B$_1$) is referred to as "recurrent light", and the reflected light 276 outputted to the third terminal (B$_3$) is referred to as "extracted light".

Wavelengths of the reflected lights 276 and 278 are determined by the period and the effective refractive index of the grating 250, and their reflectances and bandwidths are determined by the coupling coefficient (K) representing the intensity of the grating 250 and the length (L$_2$) of the grating 250. The branch rate of the reflected lights 276 and 278 is determined by the length (L$_1$) of the first sub-region 242. When the wavelength of the input light 272 coincides with the reflected wavelength of the grating 250 and the coupling coefficient representing a degree of coupling the first and second waveguides 210 and 220 is K$_{ab}$, power (P$_1$) of the recurrent light 278 and power (P$_2$) of the extracted light 276 are respectively expressed by the below Equations 1 and 2.

278 returned to the first terminal (B$_1$), it is possible to obtain the extracted light 276 without the recurrent light 278 without using an additional optical isolator. It is apparent that the first curve 410 has periodicity and thus L$_1$ can be set to various values. The performance of a conventional optical coupler type filter can be improved and the power (P$_1$) of its recurrent light can be zero (0), by adjusting the length of its coupling region or the length of its grating using a laser trimming method.

Figure 4:
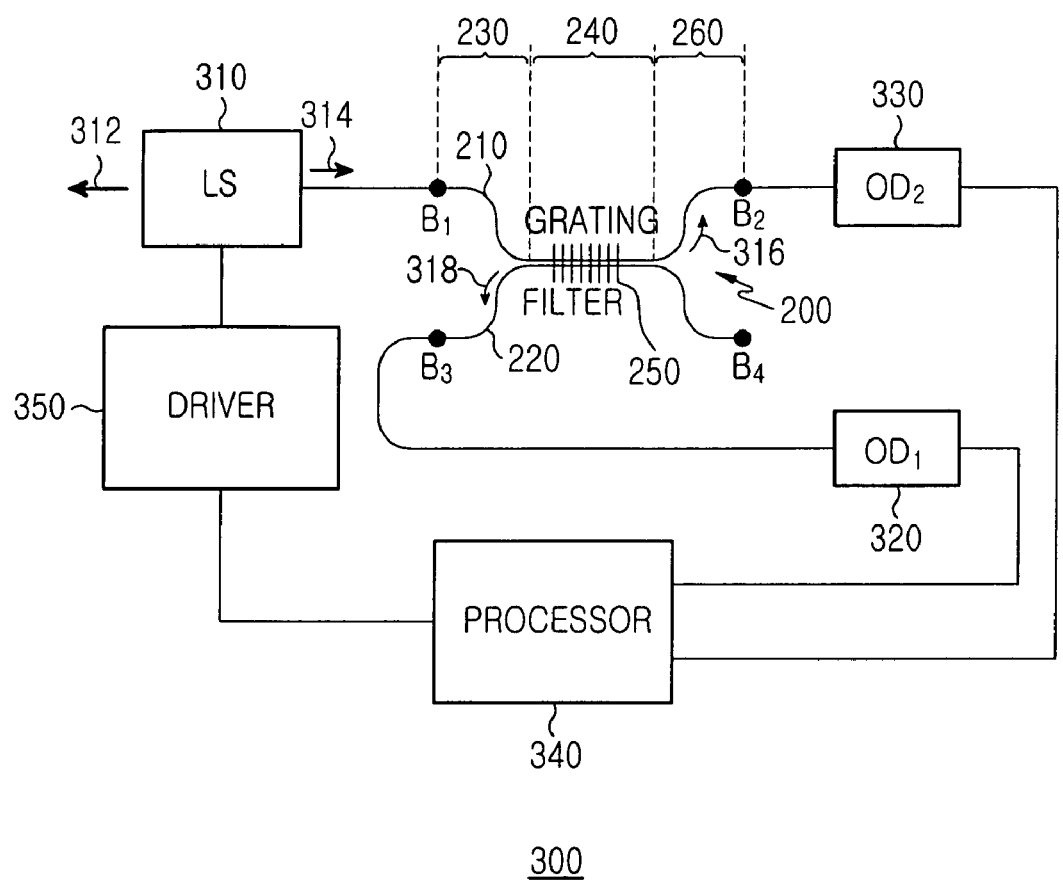
FIG. 4 is a block diagram of a wavelength stabilizing apparatus of a light source using the optical coupler type filter shown in FIG. 2 in accordance with a first embodiment of the present invention.

FIG. 4 is a block diagram of a wavelength stabilizing apparatus of a light source using the optical coupler type filter shown in FIG. 2 in accordance with a first embodiment of the present invention. The wavelength stabilizing apparatus 300 comprises a light source 310, the optical coupler type filter 200, first and second optical detectors 320 and 330, a signal processor 340, and a driver 350.

The light source 310 outputs lights 312 and 314 having predetermined wavelengths through both surfaces thereof. The light 312 outputted from the front surface of the light source 310 is used in optical communication, and the light 314 outputted from the rear surface of the light source 310 is used for stabilizing the wavelength. A semiconductor light source, such as a laser diode, may be used as light source 310.

The optical coupler type filter 200 is disposed between the light source 310 and the second optical detector 330, and includes the first waveguide 210 provided with the first and second terminals (B$_1$ and B$_2$), the second waveguide 220 provided with the third and fourth terminals (B$_3$ and B$_4$), and the coupling region 240 where the first and second waveguides 210 and 220 are adjacent to each other. The first terminal (B$_1$) is connected to the light source 310, the second terminal (B$_2$) is connected to the second optical detector 330, the third terminal (B$_3$) is connected to the first optical detector 320, and the fourth terminal (B$_4$) is a free end. The optical coupler type filter 200 is divided into three regions, i.e., the coupling region 240, the first connecting region 230 formed between the coupling region 240 and the first or third terminal (B$_1$ or B$_3$), and the second connecting region 260

$$P_1 = \left| \frac{x^*}{2} \left[ \frac{\exp(-2i|x_{ab}|L_1)\tanh\left(\sqrt{|x|^2 - |x_{ab}|^2}\, L_2\right)}{-|x_{ab}|\tanh\left(\sqrt{|x|^2 - |x_{ab}|^2}\, L_2\right) + i\sqrt{|x|^2 - |x_{ab}|^2}} + \frac{\exp(2i|x_{ab}|L_1)\tanh\left(\sqrt{|x|^2 - |x_{ab}|^2}\, L_2\right)}{|x_{ab}|\tanh\left(\sqrt{|x|^2 - |x_{ab}|^2}\, L_2\right) + i\sqrt{|x|^2 - |x_{ab}|^2}} \right] \right|^2 \quad \text{[Equation 1]}$$

$$P_2 = \left| \frac{x_{ab}^* x^*}{2|x_{ab}|} \left[ \frac{\exp(-2i|x_{ab}|L_1)\tanh\left(\sqrt{|x|^2 - |x_{ab}|^2}\, L_2\right)}{-|x_{ab}|\tanh\left(\sqrt{|x|^2 - |x_{ab}|^2}\, L_2\right) + i\sqrt{|x|^2 - |x_{ab}|^2}} - \frac{\exp(2i|x_{ab}|L_1)\tanh\left(\sqrt{|x|^2 - |x_{ab}|^2}\, L_2\right)}{|x_{ab}|\tanh\left(\sqrt{|x|^2 - |x_{ab}|^2}\, L_2\right) + i\sqrt{|x|^2 - |x_{ab}|^2}} \right] \right|^2 \quad \text{[Equation 2]}$$

Figure 3:
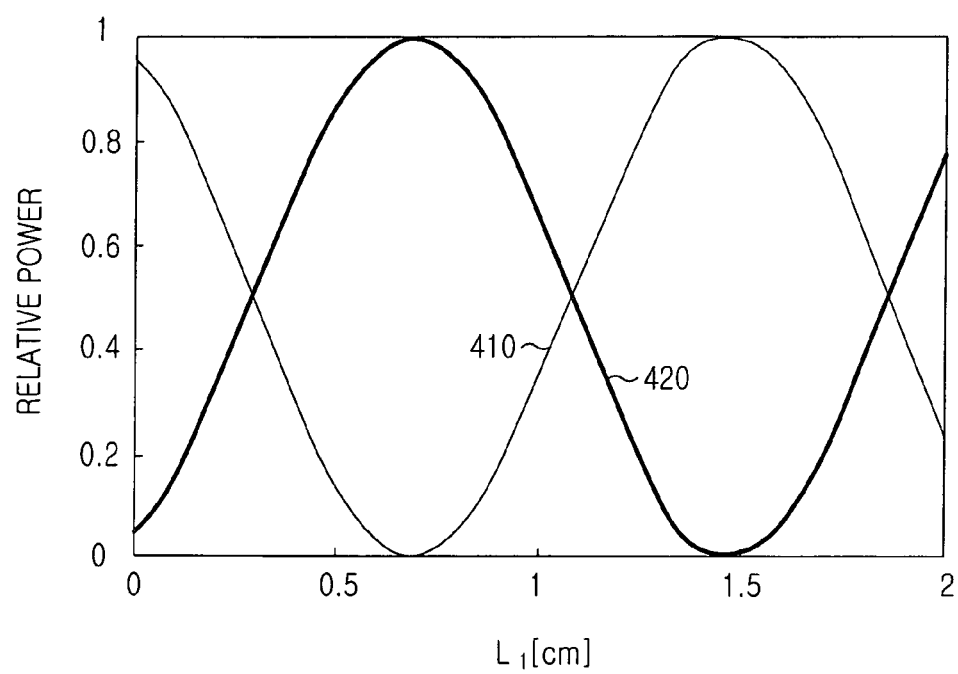
FIG. 3 is a graph illustrating output characteristics of the optical coupler type filter shown in FIG. 2.

FIG. 3 is a graph illustrating output characteristics of the optical coupler type filter shown in FIG. 2. In FIG. 3, a first curve 410 illustrates the power (P$_1$) of the recurrent light 278, and a second curve 420 illustrates the power (P$_2$) of the extracted light 276. Here, K$_{ab}$=1 cm$^{-1}$, K=5 cm$^{-1}$, L$_2$=1.175 cm, and the length (L$_1$) of the first sub-region 242 is a variable. As expected in the above Equation 1 and Equation 2, the power (P$_1$) of the recurrent light 278 and the power (P$_2$) of the extracted light 276 periodically vary based on variation in the length (L$_1$) of the first sub-region 242, and the sum (P$_1$+P$_2$) of the power (P$_1$) as the power (P$_2$) is always constant. For example, when L$_1$=0.685 cm, the power (P$_1$) of the recurrent light 278 is zero (0). Since the optical coupler type filter 200, which satisfies the above requirements, eliminates the power (P$_1$) of the recurrent light formed between the coupling region 240 and the second or fourth terminal (B$_2$ or B$_4$). The coupling region 240 includes the grating 250, and the first and second sub-regions 242 and 244 placed at both sides of the grating 250. The first sub-region 242 is disposed between the first coupling region 230 and the grating 250, and the second sub-region 244 is disposed between the grating 250 and the second coupling region 260.

The light 314 outputted from the rear surface of the light source 310 is inputted to the first terminal (B$_1$), the light 316 passed through the grating 250 is outputted to the second terminal (B$_2$), and the extracted light 318. having the predetermined wavelength ($\lambda_B$) reflected by the grating 250. is outputted to the third terminal (B$_3$). Preferably, the length of the first sub-region 242 is set to a minimum, i.e., substantially near-zero (0), value, to minimize the power of the recurrent light, which is reflected by the grating 250 and outputted to the first terminal ($B_1$).

The first optical detector 320 detects the extracted light 318 inputted from the third terminal ($B_3$) as an electric signal (hereinafter, referred to as a "first electric signal"), and the second optical detector 330 detects the transmitted light 316 inputted from the second terminal ($B_2$) as an electric signal (hereinafter, referred to as a "second electric signal"). Each of the first and second optical detectors 320 and 330 may include a photo diode.

Figure 5:
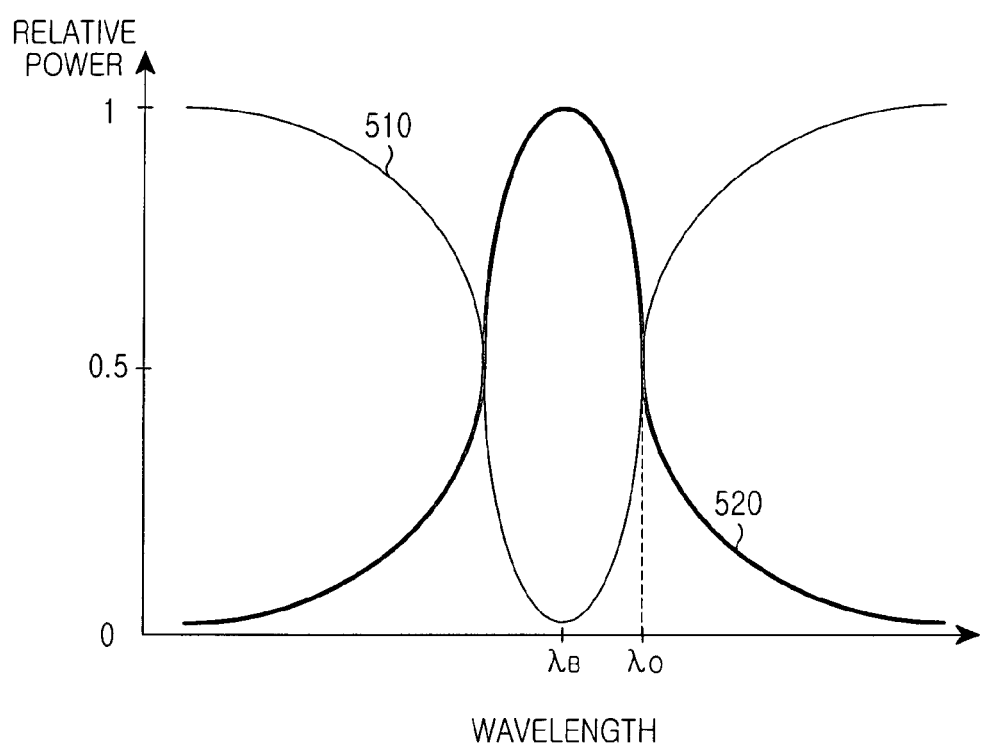
FIG. 5 is a graph illustrating output characteristics of the optical coupler type filter shown in FIG. 4.

FIG. 5 is a graph illustrating output characteristics of the optical coupler type filter shown in FIG. 4. In FIG. 5, a third curve 510 illustrates the power of the transmitted light 316, and a fourth curve 520 illustrates the power of the extracted light 318. Here, the wavelength of the light 314 inputted from the light source 310 is a variable. As shown in FIG. 5, in the case that the wavelength of the input light 314 coincides with the reflected wavelength ($\lambda_B$), the power of the extracted light 318 is maximized and the power of the transmitted light 316 is minimized. Further, the intensity and the bandwidth of the extracted light 318 are determined by the length ($L_2$) and the coupling coefficient (K) of the grating 250. On the other hand, in the case that the wavelength of the input light 314 is $\lambda_0$, the power of the extracted light 318 is the same as that of the transmitted light 316. The above uniform wavelengths are prepared in a pair at both sides of the reflected wavelength ($\lambda_B$). The uniform wavelengths are set to desired values by varying factors ($\lambda_B$, $L_2$, K, etc.) which are determining characteristics of the grating 250. The stabilizing wavelength of the light source 310 is set to one uniform wavelength of the grating 250, thereby allowing the output wavelength of the light source 310 to be stabilized.

With reference to FIG. 4, the signal processor 340 determines the wavelength of the light outputted from the light source 310 based on the powers of the first and second electric signals inputted from the first and second optical detectors 320 and 330. In the case that the light source 310 outputs light having a wavelength longer than the stabilizing wavelength ($\lambda_0$), the value of the second electric signal, corresponding to the power of the transmitted light 316, is higher than the value of the first electric signal, corresponding to the power of the extracted light 318, and the signal processor 340 outputs a control signal to the driver 350 for shifting the output wavelength of the light source 310 to be shorter. On the other hand, in the case that the light source 310 outputs light having a wavelength shorter than the stabilizing wavelength ($\lambda_0$), the value of the second electric signal, corresponding to the power of the transmitted light 316, is lower than the value of the first electric signal corresponding to the power of the extracted light 318, and the signal processor 340 outputs a control signal to the driver 350, for shifting the output wavelength of the light source 310 to be longer. The above controlling process is repeated until the output wavelength of the light source 310 becomes the stabilizing wavelength ($\lambda_0$) so that the values of the first and second electric signals coincide with each other, thereby stabilizing the output wavelength to a desired wavelength. This controlling process is exemplary, and other various stabilizing methods, such as a method for detecting deflection points of the powers of the first and second electric signals by comparing front and rear values to each other by the signal processor 340, may be used.

The driver 350 stabilizes the output wavelength of the light source 310 based on the control signal. For example, the driver 350 may increase or decrease the operating temperature of the light source 310 so as to stabilize the wavelength. Further, the driver 350 may increase or decrease the intensity of current supplied to the light source 310 so as to stabilize the wavelength.

Figure 6:
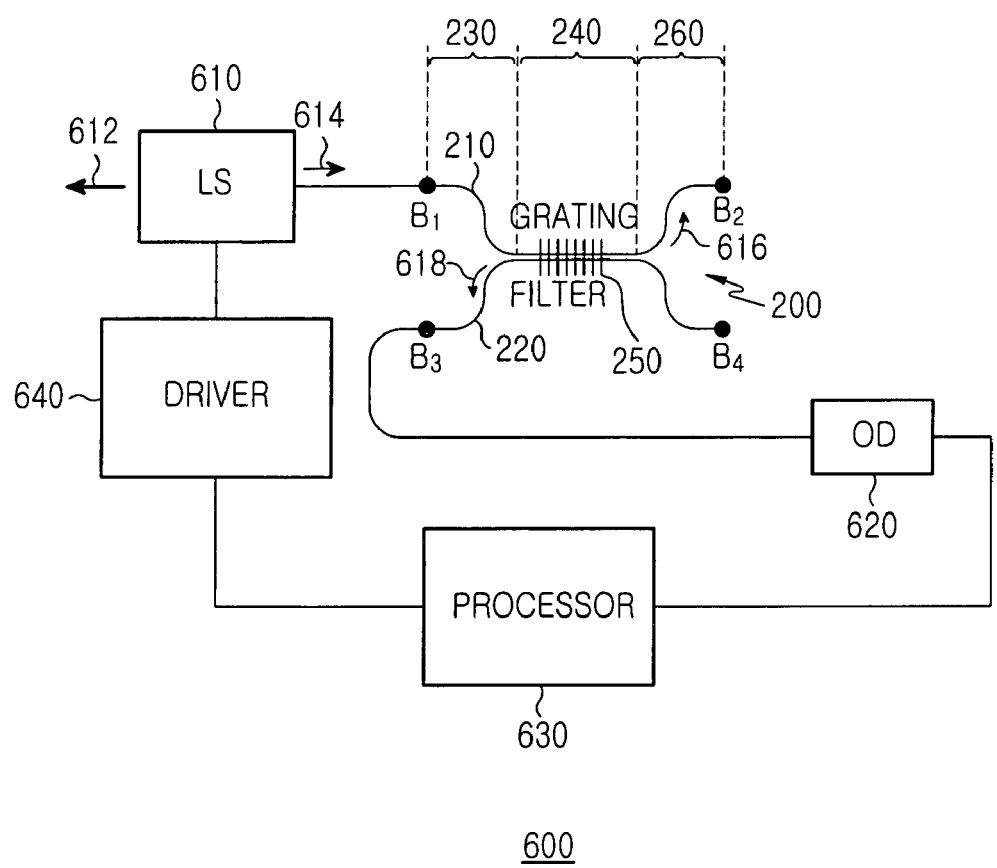
FIG. 6 is a block diagram of a wavelength stabilizing apparatus of a light source using the optical coupler type filter shown in FIG. 2 in accordance with a second embodiment of the present invention.

FIG. 6 is a block diagram of a wavelength stabilizing apparatus of a light source using the optical coupler type filter shown in FIG. 2 in accordance with a second embodiment of the present invention. The wavelength stabilizing apparatus 600 comprises a light source 610, the optical coupler type filter 200, an optical detector 620, a signal processor 630, and a driver 640. Components of the wavelength stabilizing apparatus 600 are the same as those of the wavelength stabilizing apparatus 300 shown in FIG. 4 except for the optical detector 620, and the detailed descriptions of the same components will be omitted.

Figure 7:
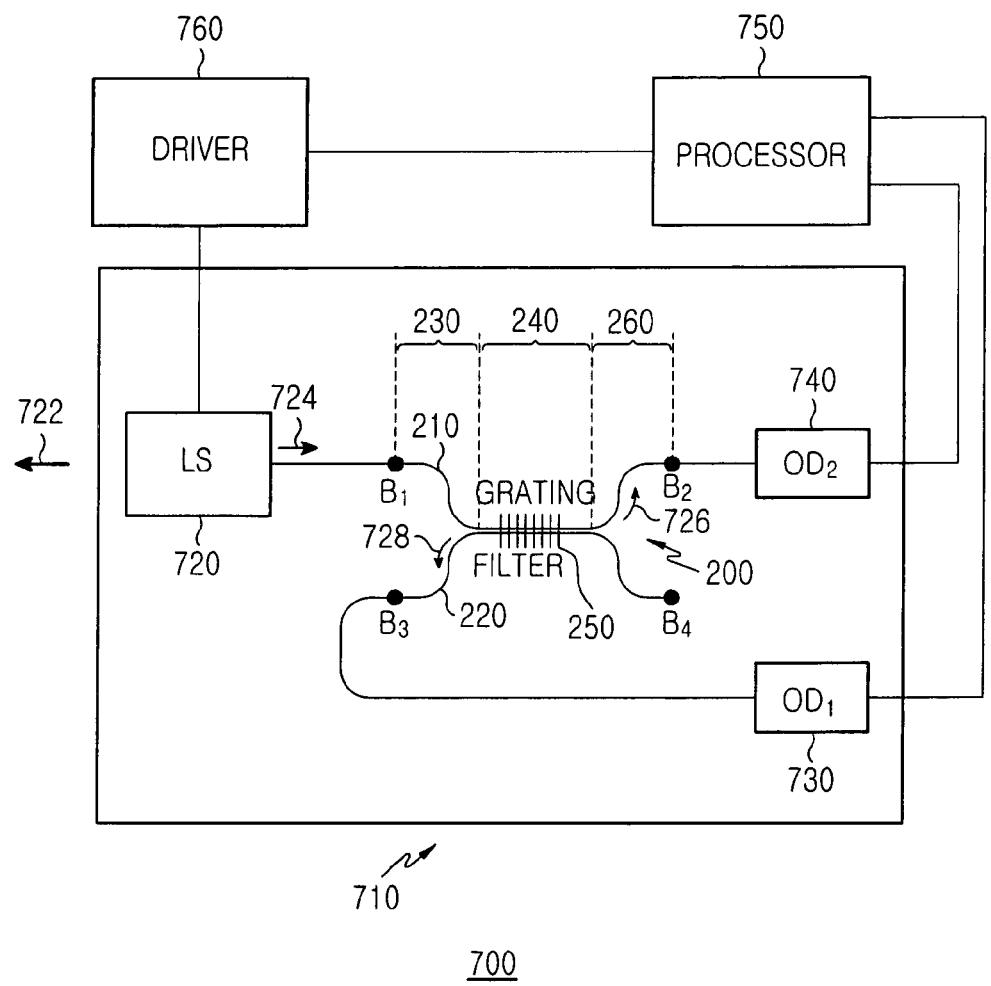
FIG. 7 is a block diagram of a wavelength stabilizing apparatus of a light source using the optical coupler type filter shown in FIG. 3 in accordance with a third embodiment of the present invention.

The light source 610 outputs lights 612 and 614 having predetermined wavelengths through both surfaces thereof. The light 612 outputted from the front surface of the light source 610 is used in optical communication, and the light 614 outputted from the rear surface of the light source 610 is used for stabilizing the wavelength. The light 614 outputted from the rear surface of the light source 610 is inputted to the first terminal ($B_1$) of the optical coupler type filter 200, the light 616 passing through grating 250 is outputted to the second terminal ($B_2$), and the extracted light 618 having the predetermined wavelength ($\lambda_B$) reflected by the grating 250 is outputted to the third terminal ($B_3$). Preferably, the length of the first sub-region 242 is set to a minimum value, substantially near-zero (0), to minimize the power of the recurrent light, which is reflected by the grating 250 and outputted to the first terminal ($B_1$). Further, the stabilizing wavelength of the light source 610 is set to coincide with the reflected wavelength of the grating 250. The optical detector 620 detects the extracted light 618 inputted from the third terminal ($B_3$) as an electric signal. The signal processor 630 determines the wavelengths of the lights 612 and 614 outputted from the light source 610 based on the power of the electric signal inputted from the optical detector 620. The signal processor 630 stores data regarding the value of the outputted electric signal according to variation in the wavelength, and the data are used to output the control signal for stabilizing the wavelength to a wavelength desired by the light source 610 as previously described FIG. 7 is a block diagram of a wavelength stabilizing apparatus of a light source using the optical coupler type filter shown in FIG. 2 in accordance with a third embodiment of the present invention. The wavelength stabilizing apparatus 700 comprises a light source 720, the optical coupler type filter 200, first and second optical detectors 730 and 740, a signal processor 750, and a driver 760. Components of the wavelength stabilizing apparatus 700 are the same as those of the wavelength stabilizing apparatus 300 shown in FIG. 4 except that the light source 720, the optical coupler type filter 200 and the first and second optical detectors 730 and 740 are integrated into a planar lightwave circuit 710, and the detailed descriptions of the same components will be omitted.

In this case, light 724 outputted from the rear surface of the light source 720 is inputted to the first terminal ($B_1$), light 726 passing through grating 250 is outputted to the second terminal ($B_2$), and extracted light 728 having the predetermined wavelength ($\lambda_B$) reflected by the grating 250 is outputted to the third terminal ($B_3$). Preferably, the length of the first sub-region 242 is set to a minimum value, e.g., substantially near-zero (0), to minimize the power of the recurrent light, which is reflected by the grating 250 and outputted to the first terminal ($B_1$).

The first optical detector 730 detects the extracted light 728 inputted from the third terminal (B₃) as an electric signal (hereinafter, referred to as "first electric signal"), and the second optical detector 740 detects the transmitted light 726 inputted from the second terminal (B₂) as an electric signal (hereinafter, referred to as "second electric signal"). Each of the first and second optical detectors 730 and 740 may include a photo diode.

The signal processor 750 determines the wavelength of the light outputted from the light source 720 based on the values of the first and second electric signals inputted from the first and second optical detectors 730 and 740. In the case that the light source 720 outputs light having a wavelength longer than the stabilizing wavelength ($\lambda_0$), the value of the second electric signal corresponding to the power of the transmitted light 726, is higher than the value of the first electric signal corresponding to the power of the extracted light 728, and the signal processor 750 outputs a control signal, for shifting the output wavelength of the light source 720 so as to be shorter, to the driver 760. On the other hand, in the case that the light source 720 outputs light having a wavelength shorter than the stabilizing wavelength ($\lambda_0$), the value of the second electric signal corresponding to the power of the transmitted light 726, is lower than the value of the first electric signal corresponding to the power of the extracted light 728, and the signal processor 750 outputs a control signal, for shifting the output wavelength of the light source 720 so as to be longer, to the driver 760. The above controlling process is repeated until the output wavelength of the light source 720 becomes the stabilizing wavelength ($\lambda_0$) so that the values of the first and second electric signals coincide with each other, thereby stabilizing the output wavelength to a desired wavelength.

The driver 760 stabilizes the output wavelength of the light source 720 based on the control signal. For example, the driver 760 may increase or decrease the operating temperature of the light source 720 so as to stabilize the wavelength. Further, the driver 760 may increase or decrease the intensity of current supplied to the light source 720 so as to stabilize the wavelength.

Figure 8:
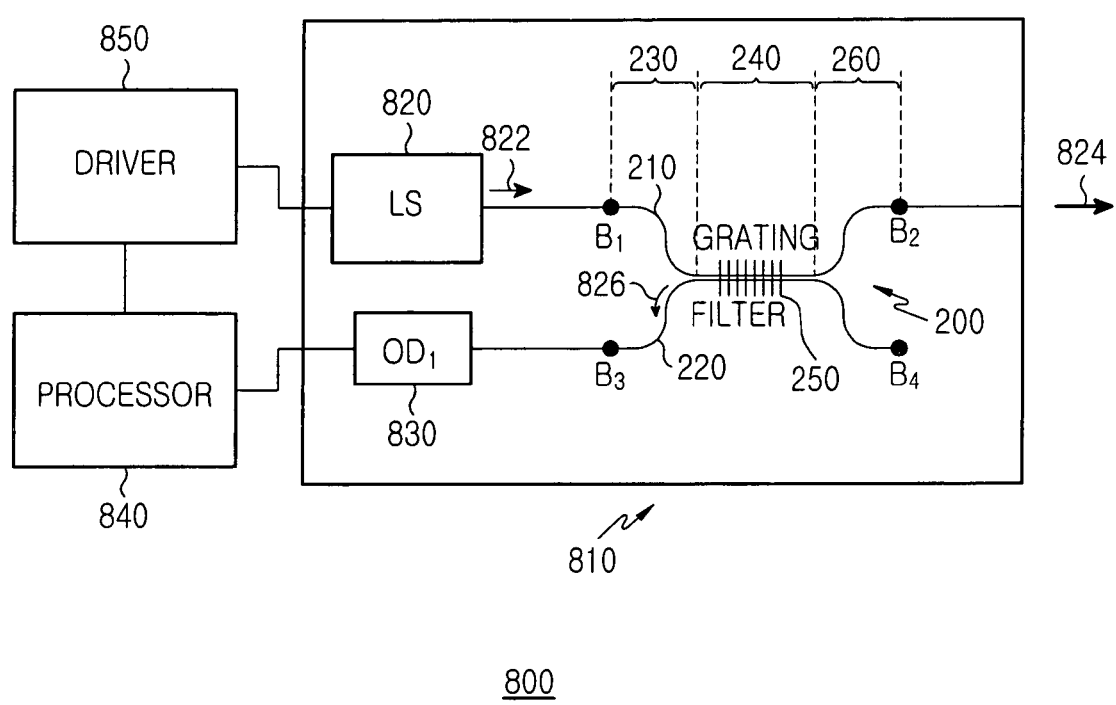
FIG. 8 is a block diagram of a wavelength stabilizing apparatus of a light source using the optical coupler type filter shown in FIG. 2 in accordance with a fourth embodiment of the present invention.

FIG. 8 is a block diagram of a wavelength stabilizing apparatus of a light source using the optical coupler type filter shown in FIG. 2 in accordance with a fourth embodiment of the present invention. The wavelength stabilizing apparatus 800 comprises a light source 820, the optical coupler type filter 200, an optical detector 830, a signal processor 840, and a driver 850. Components of the wavelength stabilizing apparatus 800 are the same as those of the wavelength stabilizing apparatus 300 shown in FIG. 4 except that the wavelength stabilizing apparatus 800 comprises a single optical detector 830 and the light source 820, the optical coupler type filter 200 and the optical detector 830 are integrated into a planar lightwave circuit 810, and the detailed descriptions of the same components will be omitted.

The light source 820 outputs light 822 having a predetermined wavelength through both surfaces thereof. Light 822 outputted from the light source 820 is inputted to the first terminal (B₁) of the optical coupler type filter 200, light 824 passing through the grating 250 is outputted to the second terminal (B₂), and extracted light 826 having the predetermined wavelength ($\lambda_B$) reflected by the grating 250 is outputted to the third terminal (B₃). Preferably, the length of the first sub-region 242 is set to a substantially near-zero (0), to minimize the power of the recurrent light, which is reflected by the grating 250 and outputted to the first terminal (B₁). Further, the stabilizing wavelength of the light source 820 is set to coincide with the reflected wavelength ($\lambda_B$) of the grating 250.

The optical detector 830 detects the extracted light 826 inputted from the third terminal (B₃) and outputs an electric signal.

The signal processor 840 controls the wavelengths of the light 822 outputted from the light source 820 based on the value of the electric signal inputted from the optical detector 830. The signal processor 840 stores data regarding the value of the outputted electric signal according to variation in the wavelength, and the data are used to output the control signal for stabilizing the wavelength to a wavelength desired by the light source 820.

The driver 850 stabilizes the output wavelength of the light source 820 based on the control signal. For example, the driver 850 may increase or decrease the operating temperature of the light source 820 so as to stabilize the wavelength. Further, the driver 850 may increase or decrease the intensity of current supplied to the light source 820 so as to stabilize the wavelength.

As apparent from the above description, the present invention provides a wavelength stabilizing apparatus of a light source, which is formed in an optical fiber type or is integrated into a planar lightwave circuit without using an optical isolator, thereby stabilizing the wavelength outputted from the light source to a desired wavelength.

Further, the wavelength stabilizing apparatus of the present invention does not require an optical isolator, which cannot be integrated into the planar lightwave circuit, thereby satisfying low-priced and miniaturized trends.

Although preferred embodiments of the present invention have been described in detail, those skilled in the art will appreciate that various modifications, additions, and substitutions to the specific elements are possible, without departing from the scope and spirit of the invention as disclosed in the accompanying claims.

What is claimed is:

1. An optical coupler type filter comprising:
    a first waveguide, provided with first and second terminals, receiving light inputted from an external light source;
    a second waveguide provided with a third terminal;
    a coupling region, wherein the first and second waveguides are adjacent to each other so as to couple light between said first and second waveguides; and
    a grating, disposed in the coupling region, for outputting an extracted light, having a wavelength coinciding with a reflected wavelength, from the received light inputted from the first terminal, to the third terminal and outputting a residual transmitted light, from the received light inputted from the first terminal, to the second terminal,
    wherein the length of a sub-region of the coupling region formed between the grating and the first terminal is set to minimize the power of a recurrent light reflected by the grating, having a wavelength coinciding with the reflected wavelength from the received light inputted from the first terminal and outputted to the first terminal.

2. A wavelength stabilizing apparatus of a light source, comprising:
    an optical coupler type filter including a first waveguide provided with first and second terminals, a second waveguide provided with a third terminal, a coupling region where the first and second waveguides are adjacent to each other so as to couple lights, and a grating disposed in the coupling region;

a light source for outputting light to the first terminal;

a first optical detector for detecting extracted light outputted from the third terminal as a first electric signal;

a signal processor for determining the wavelength of the light outputted from the light source based on the value of the first electric signal, and outputting a control signal when the wavelength of the light deviates from a stabilizing wavelength; and a driver for controlling the output wavelength of the light source based on the control signal, wherein the length of a sub-region of the coupling region, which is formed between the grating and the first terminal, is set to minimize the power of a recurrent light reflected by the grating and outputted to the first terminal.

3. The wavelength stabilizing apparatus as set forth in claim 2, wherein the signal processor stores data regarding the value of the outputted electric signal according to variation in the wavelength, and determines the output wavelength of the light source based on the value of the outputted electric signal.

4. The wavelength stabilizing apparatus as set forth in claim 2, wherein the light source, the optical coupler type filter, and the optical detector are integrated into a planar lightwave circuit.

5. The wavelength stabilizing apparatus as set forth in claim 2, further comprising:

a second optical detector for detecting transmitted light outputted from the second terminal as a second electric signal, wherein the signal processor determines the wavelength of the light outputted from the light source based on the values of the first and second electric signals.

6. The wavelength stabilizing apparatus as set forth in claim 5, wherein the stabilizing wavelength is set to a uniform wavelength in which the powers of extracted light and transmitted light outputted from the grating are the same.

7. The wavelength stabilizing apparatus as set forth in claim 5, wherein the light source, the optical coupler type filter, and the first and second optical detectors are integrated into a planar lightwave circuit.

8. A wavelength stabilized light source comprising:

a light source for outputting light to the first terminal of an optical coupler, a first optical detector for detecting light outputted from a third terminal of said optical coupler, said first optical detector providing a first electric signal dependent upon said light outputted from said third terminal;

a signal processor for determining the wavelength of the light outputted from the light source based on the value of the first electric signal, and outputting a control signal when the wavelength of the light deviates from a stabilizing wavelength; and a driver for controlling the output wavelength of the light source based on the control signal, wherein the optical coupler comprises:

a first waveguide coupled between the first terminal and a second terminal;

a second waveguide coupled between the third terminal and a fourth terminal;

a coupling region for coupling light between the first and second waveguides, comprising:

a grating disposed in the coupling region for reflecting a known wavelength and passing a remaining wavelength; and a sub-region formed between the grating and the first terminal, the length of the sub-region is set to minimize the power of the reflected wavelength outputted to the first terminal.

9. The wavelength stabilized light source as recited in claim 8, wherein the length of the sub-region is set to a substantially zero value.

10. The wavelength stabilized light source as recited in claim 8, further comprising:

a second optical detector for detecting light outputted from the second terminal of said optical coupler, said second optical detector providing a second electric signal dependent upon said light outputted from said second terminal; and the signal processor receiving said second electrical signal for determining the wavelength of the light outputted from the light source based on the value of the first and second electric signals.

11. The wavelength stabilized light source as recited in claim 8, wherein said light source is selected from the group consisting of laser diode and superluminscent diode.

12. The wavelength stabilized light source as recited in claim 8, wherein said first optical detector includes a photo diode.

13. The wavelength stabilized light source as recited in claim 10, wherein said second optical detector includes a photo diode.

14. The wavelength stabilized light source as recited in claim 8, wherein the intensity of the reflected wavelength is dependent upon a length ($L_2$) and a coupling coefficient (K) of the grating.

15. The wavelength stabilized light source as recited in claim 8, wherein said stabilized wavelength corresponds to the wavelength reflected by the grating.

* * * * *